United States Patent
Farrell et al.

(10) Patent No.: US 8,330,265 B2
(45) Date of Patent: Dec. 11, 2012

(54) RF TRANSISTOR PACKAGES WITH INTERNAL STABILITY NETWORK AND METHODS OF FORMING RF TRANSISTOR PACKAGES WITH INTERNAL STABILITY NETWORKS

(75) Inventors: Donald Farrell, Raleigh, NC (US); Simon Wood, Raleigh, NC (US)

(73) Assignee: Cree, Inc., Durham, NC (US)

( * ) Notice: Subject to any disclaimer, the term of this patent is extended or adjusted under 35 U.S.C. 154(b) by 242 days.

(21) Appl. No.: 11/767,172

(22) Filed: Jun. 22, 2007

(65) Prior Publication Data
US 2008/0315393 A1   Dec. 25, 2008

(51) Int. Cl.
H01L 23/48   (2006.01)
(52) U.S. Cl. .......... 257/690; 257/691; 438/106; 333/32
(58) Field of Classification Search ................. 257/691, 257/68, 532, 535, 924, 690; 333/32; 438/106
See application file for complete search history.

(56) References Cited

U.S. PATENT DOCUMENTS

| | | | |
|---|---|---|---|
| 3,969,752 A * | 7/1976 | Martin et al. ................. | 257/531 |
| 4,193,083 A | 3/1980 | Max | |
| 5,942,957 A | 8/1999 | Mohwinkel et al. | |
| 5,955,926 A * | 9/1999 | Uda et al. ..................... | 330/295 |
| 6,798,295 B2 | 9/2004 | Pengelly et al. | |
| 6,806,106 B2 | 10/2004 | Leighton et al. | |
| 6,822,321 B2 * | 11/2004 | Crescenzi, Jr. ............... | 257/691 |
| 2002/0013048 A1 * | 1/2002 | Macheel et al. .............. | 438/650 |
| 2002/0020894 A1 | 2/2002 | Nishijima | |
| 2004/0061214 A1 * | 4/2004 | Crescenzi, Jr. ............... | 257/691 |
| 2006/0207970 A1 * | 9/2006 | Dunn et al. .................... | 216/65 |
| 2008/0094141 A1 * | 4/2008 | Gotou et al. ................... | 330/295 |
| 2008/0166986 A1 * | 7/2008 | Anand ............................ | 455/260 |

FOREIGN PATENT DOCUMENTS

| | | |
|---|---|---|
| JP | 56-064459 A | 6/1981 |
| JP | 57-91542 A | 6/1982 |
| JP | 5226951 (A) | 9/1993 |
| JP | 05-267956 A | 10/1993 |
| JP | 11251849 (A) | 9/1999 |
| WO | WO 01/56082 A1 | 8/2001 |

OTHER PUBLICATIONS

International Search Report and Written Opinion (15 pages) corresponding to International Application No. PCT/US2008/006948; Mailing Date: Dec. 5, 2008.
Japanese Office Action Corresponding to Japanese Patent Application No. 2010-513191; Mailing Date: Dec. 27, 2011; 4 pages.
Japanese Office Action mailed Sep. 11, 2012 for corresponding application No. 2010-513191 (no translation available at this time).

* cited by examiner

*Primary Examiner* — N Drew Richards
*Assistant Examiner* — Yu-Hsi D Sun
(74) *Attorney, Agent, or Firm* — Myers Bigel Sibley & Sajovec

(57) ABSTRACT

A packaged RF transistor device includes an RF transistor die including a plurality of RF transistor cells. Each of the plurality of RF transistor cells includes a control terminal and an output terminal. The RF transistor device further includes an RF input lead, and an input matching network coupled between the RF input lead and the RF transistor die. The input matching network includes a plurality of capacitors having respective input terminals. The input terminals of the capacitors are coupled to the control terminals of respective ones of the RF transistor cells.

22 Claims, 3 Drawing Sheets

RF TRANSISTOR PACKAGES WITH INTERNAL STABILITY NETWORK AND METHODS OF FORMING RF TRANSISTOR PACKAGES WITH INTERNAL STABILITY NETWORKS

FIELD

This invention relates generally to RF transistors, and more particularly the invention relates to packaged RF transistors having input matching networks, and methods of forming packaged RF transistors having input matching networks.

BACKGROUND

Packaged RF power devices typically include a transistor die mounted on a base and enclosed in a package. An RF input signal is supplied to the transistor through an RF input lead that extends from outside the package to the inside of the package, and an RF output signal is delivered from the device through an RF output lead that extends from inside the package to the outside. An input matching circuit can be included within the package, and can be connected between the RF input lead and an input terminal of the RF transistor. The input matching circuit provides an impedance match at the input of the transistor at the fundamental operating frequency of the transistor.

The RF transistor can include a large periphery transistor die that includes a number of discrete transistor cells on a common substrate and connected in parallel. Input matching can be particularly beneficial for such devices, as it can increase the usable bandwidth of the devices. However, the input matching network typically includes a single capacitor, which can create a lower frequency feedback path between adjacent cells of the large periphery transistor die. This feedback path can reduce the stability of the overall device.

Furthermore, the impedance values of elements of the input matching network must be carefully selected to avoid creating odd mode oscillations. Selection of the impedance values, including selection of appropriate inductances through bond wire lengths, can limit the topology of the matching network.

SUMMARY

A packaged RF transistor device according to some embodiments includes an RF transistor die including a plurality of RF transistor cells. Each of the plurality of RF transistor cells includes a control terminal and an output terminal. The RF transistor device further includes an RF input lead, and an input matching network coupled between the RF input lead and the RF transistor die. The input matching network includes a plurality of capacitors having respective input terminals. The input terminals of the capacitors are coupled to the control terminals of respective ones of the RF transistor cells.

The input network may further include first wire bonds between the RF input lead and the input terminals of respective ones of the capacitors, and second wire bonds between the input terminals of respective ones of the capacitors and the control terminals of respective ones of the RF transistor cells.

The packaged RF transistor device may further include an RF output lead coupled to the output terminals of respective ones of the RF transistor cells, and a package that houses the RF transistor die and the input matching network, with the RF signal input lead and the RF signal output lead extending from the package.

The packaged RF transistor device may further include a base, and the RF transistor die may be mounted on the base between the RF input lead and the RF output lead. The plurality of capacitors may be provided as a capacitor block on the base between the RF input lead and the RF transistor die. The capacitor block may include a common ground terminal and a plurality of discrete input terminals, and may further include a common dielectric. In some embodiments, the plurality of capacitors include a plurality of discrete devices.

A packaged RF transistor device according to further embodiments includes an RF transistor die including a plurality of RF transistor cells. Each of the plurality of RF transistor cells includes a control terminal and an output terminal. The packaged RF transistor device further includes an RF input lead and an input matching network coupled between the RF input lead and the RF transistor die. The input matching network includes a split capacitor having a plurality of input terminals. The input terminals of the split capacitor are coupled to the control terminals of respective ones of the RF transistor cells.

The input network may further include first wire bonds between the RF input lead and respective input terminals of the split capacitor, and second wire bonds between the respective input terminals of the split capacitor and the control terminals of respective ones of the RF transistor cells.

The packaged RF transistor device may further include an RF output lead coupled to the output terminals of respective ones of the RF transistor cells, and a package that houses the RF transistor die and the input matching network, with the RF signal input lead and the RF signal output lead extending from the package.

The packaged RF transistor device may further include a base, and the RF transistor die may be mounted on the base between the RF input lead and the RF output lead. The split capacitor may be on the base between the RF input lead and the RF transistor die. The split capacitor may include a common ground terminal and/or a common dielectric.

Some embodiments of the invention provide methods of forming a packaged RF transistor device. The methods include mounting a transistor including a plurality of RF transistor cells on a base. Each of the plurality of RF transistor cells includes a control terminal and an output terminal. The methods further include mounting a plurality of capacitors having respective input terminals on the base, coupling the input terminals of the capacitors to the control terminals of respective ones of the RF transistor cells, and coupling an RF input lead to the input terminals of the capacitors.

The methods may further include forming a package housing on the base, the housing enclosing the transistor and the plurality of capacitors, with the RF input lead extending from the package. Coupling the RF input lead to the input terminals of the capacitors may include forming first wire bonds between the RF input lead and the input terminals of respective ones of the capacitors, and coupling the input terminals of the capacitors to the control terminals of respective ones of the RF transistor cells may include forming second wire bonds between the input terminals of respective ones of the capacitors and the control terminals of respective ones of the RF transistor cells.

The methods may further include coupling an RF output lead to the output terminals of respective ones of the RF transistor cells, and forming a package housing that houses the RF transistor die and the plurality of capacitors, with the RF signal input lead and the RF signal output lead extending from the package.

The methods may further include mounting the RF transistor die on the base between the RF input lead and the RF output lead, and mounting the plurality of capacitors may include mounting a capacitor block on the base between the RF input lead and the RF transistor die. The capacitor block may include a common ground terminal and a plurality of discrete input terminals. The capacitor block may further include a common dielectric. In some embodiments, the plurality of capacitors may include a plurality of discrete devices.

According to further embodiments of the invention, a packaged RF transistor device includes an RF transistor die including a plurality of RF transistor cells, each of the plurality of RF transistor cells including a control terminal and an output terminal, an RF input lead and an RF output lead, and a matching network coupled between the RF input lead or the RF output lead and the RF transistor die. The matching network includes a plurality of capacitors having respective input terminals. The input terminals of the capacitors are coupled to corresponding control terminals or output terminals of respective ones of the RF transistor cells.

In some embodiments, the matching network includes an output matching network coupled between the RF output lead and the RF transistor die, and the input terminals of the capacitors are coupled to corresponding output terminals of respective ones of the RF transistor cells.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
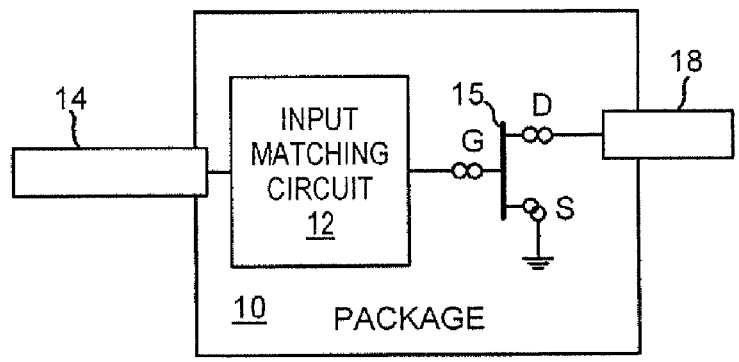
FIG. 1 is a functional block diagram of a conventional RF power transistor.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Some embodiments of the invention provide packaged RF power transistors. RF power transistors typically include a plurality of transistor cells operating in parallel. Transistors that can be included in packages according to embodiments of the invention can include laterally diffused MOSFETS (LDMOSFET) or other semiconductor devices, such as bipolar devices, MESFET devices, HBTs and HEMT devices. The transistors can be made using narrow or wide bandgap semiconductors. For example, the transistors can include silicon LDMOS and/or bipolar transistors, and/or III-V devices such as GaAs MESFETs, InGaP HBTs, GaN HEMT devices, GaN bipolar transistors, etc.

RF power transistors providing 10 watts or more of power can be packaged as discrete devices, as shown schematically at 10 in FIG. 1. The packaged transistor 15 (which may include a FET or bipolar device, for example) normally includes an input matching circuit 12 connecting an RF input lead 14 to a control electrode of the transistor 15 (e.g., a gate G of a FET or a base of a bipolar transistor). The transistor 15 may be a large periphery RF transistor including a plurality of transistor cells connected in parallel. An RF output lead 18 is connected to an output electrode of the transistor 15 (e.g., the drain D of a FET or the collector or emitter of a bipolar transistor). The RF input lead 14 and the RF output lead 18 extend outside the package 10, as shown in FIG. 1. The source S of the FET 15 may be grounded.

A packaged transistor 10 may be mounted on a printed circuit board (not shown). An external output matching circuit (not shown) may also be mounted on the printed circuit board. A bias/RF diplexer (not shown) may be connected to the external output matching circuit to connect the transistor output to an RF output. Furthermore, a DC power supply (not shown) may be connected to the transistor's RF output lead 18.

Internal matching networks have been provided within RF power transistor packages, as illustrated in FIG. 1. However, such internal matching networks typically include a single capacitor. As explained above, including the capacitor within the device package can create a lower frequency feedback path between adjacent cells of a large periphery transistor die, which can reduce the stability of the overall device.

According to some embodiments of the invention, an internal matching network of a packaged RF transistor includes a plurality of parallel capacitors. Wirebond connections are provided from the plurality of the capacitors to respective cells of a multi-cell RF transistor die.

For example, an internal matching network can include a split capacitor and/or multiple capacitors on the base of the package adjacent the multi-cell RF transistor die. Providing an input matching network including a plurality of parallel capacitors can reduce and/or remove the low frequency feedback path(s), which can improve the stability of the packaged device.

Figure 2A:
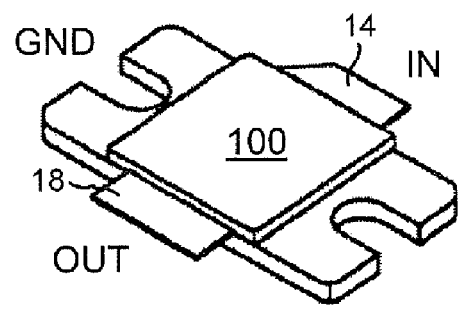
FIG. 2A is a perspective view of a packaged RF power transistor according to some embodiments of the invention.
Figure 2B:
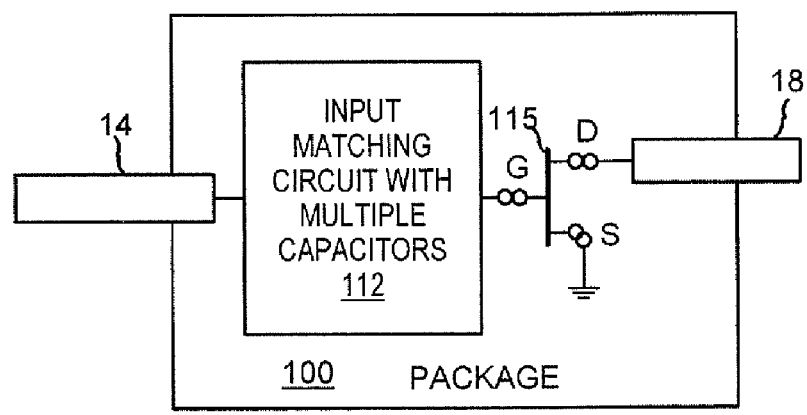
FIG. 2B is a functional block diagram of a packaged RF power transistor according to some embodiments of the invention.

A packaged RF transistor 100 according to some embodiments of the invention is shown generally in FIG. 2A and schematically in FIG. 2B. As shown therein, the packaged transistor 100 includes an RF input lead 14 and an RF output lead 18 that extend outside the package. The RF input lead 14 is connected through an input matching circuit 112 to a control terminal (such as the gate G) of a transistor 115, which can include a plurality of transistor cells connected in parallel. An output terminal (such as the drain D) of the transistor 115 is connected to the RF output lead 18. According to some embodiments, the input matching circuit includes multiple capacitors. Respective ones of the capacitors in the input matching circuit may be coupled to a respective transistor cell of the RF transistor 115.

Figure 3:
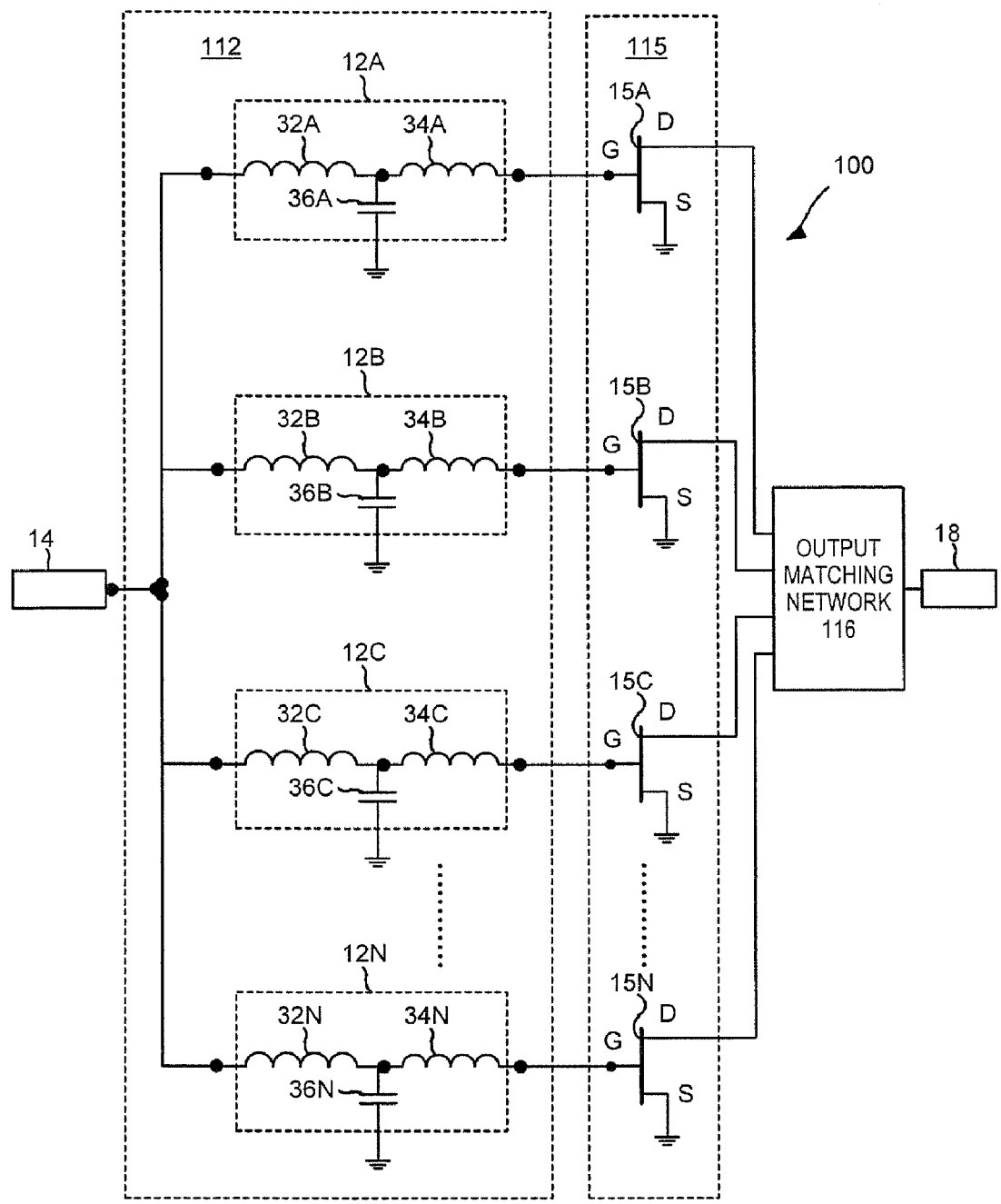
FIG. 3 is a schematic circuit diagram of a packaged RF power transistor according to some embodiments of the invention.
Figure 4:
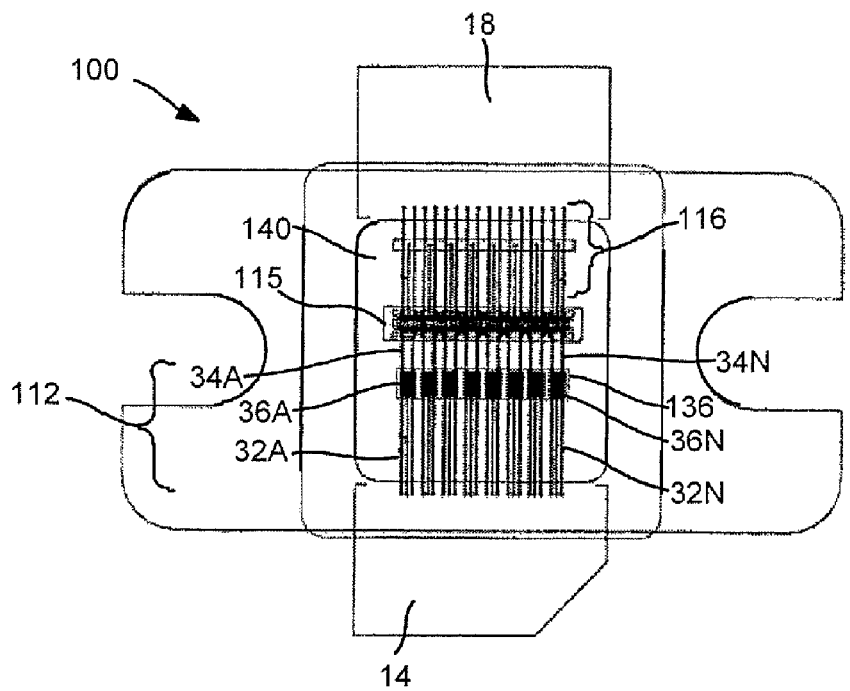
FIG. 4 is a plan view of a layout of a packaged RF power transistor according to some embodiments of the invention.

A schematic circuit diagram for a package 100 including an RF power transistor 115 and an input matching network 112 according to embodiments of the invention is illustrated in FIG. 3, and a physical layout of a package 100 according to embodiments of the invention is illustrated in FIG. 4. Referring to FIGS. 3 and 4, a package 100 includes an RF transistor 115 including a plurality of parallel transistor cells 15A-N. Although FIG. 3 illustrates an RF transistor 115 including four parallel cells 15A, 15B, 15C and 15N, it will be appreciated that the RF transistor 115 can have more than four, or less than four, parallel cells, according to embodiments of the invention. Each of the transistor cells 15A-N includes a control or input terminal and an output terminal. For example, in embodiments including a FET device, each of the transistor cells includes a gate G, a drain D and a source S. In some embodiments, the gate G corresponds to the control or input terminal and the drain D corresponds to the output terminal, while the source S is grounded, as shown in FIG. 3.

An input matching network 112 is connected between an RF signal input lead 14 and gates G of the transistor cells 15A-N. The input matching circuit 112 may include a plurality of inductive wire bond connections including bond wires extending between the RF signal input lead 14 and a capacitor block 136, and inductive wire bond connections including bond wires extending from the capacitor block 136 to the gates of the transistors 15A-N.

The input matching network 112 includes a plurality of input matching circuits 12A to 12N, each of which is connected between the RF signal input lead 14 and a respective cell 15A-N of the RF transistor 115. Each of the input matching networks 12A-N includes a first inductance 32A-N, a second inductance 34A-N and a capacitor 36A-N. As illustrated in FIG. 4, the first inductance 32A-N can be provided by a wire bond connection between the RF input lead 14 and a terminal of a corresponding capacitor 36A-N. The second inductance 34A-N can be provided by a wire bond connection between the terminal of the corresponding capacitor 36A-N and an input terminal of a corresponding cell 15A-N of the RF transistor 115.

Figure 5:
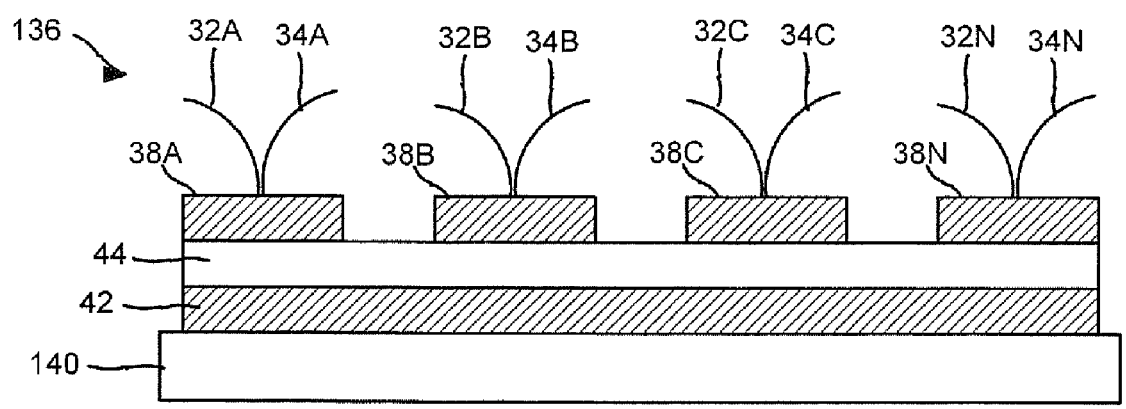
FIG. 5 is a cross sectional view of a split capacitor in accordance with some embodiments of the invention.

The capacitors 36A-N of the input matching network can be provided in a capacitor block 136 that can include discrete capacitor devices and/or can include a split capacitor, as illustrated in FIG. 5. Referring to FIG. 5, the capacitor block 136 can include a split capacitor including a plurality of discrete input terminals 38A to 38N provided on a common dielectric 44 and a common ground terminal 42 on the base 140, as illustrated in FIGS. 4 and 5. The wire bonds 32A-N connecting the RF input lead 14 to the input terminals 38A-N and the wire bonds 34A-N connecting the input terminals 38A-N to the input terminals of the respective transistor cells 15A-N are also partially illustrated in FIG. 5.

In the embodiments illustrated in FIGS. 3 and 4, the output terminals of the transistor cells 15A to 15N are connected to the RF output lead 18 through an output matching network 116. The design of output matching networks is well known in the art, and need not be described in detail herein.

As shown in FIG. 4, the capacitor block 136 can be mounted on the base 140 of the package 100 adjacent to the transistor 15. It will be appreciated that the base of the package 100 can refer to any structural member on which the transistor 15 is mounted, and accordingly can correspond to a substrate, flange, die carrier, or the like.

While embodiments of the present application have been described primarily in connection with an input matching circuit, embodiments of the invention may be used in an output matching circuit, such as the output matching circuit 116 illustrated in FIGS. 3 and 4. For example, a capacitor block 136 including a split capacitor as shown in FIG. 5 could be provided in the output matching circuit 116 according to some embodiments. In such embodiments, an output terminal (e.g., the drain D) of each of the transistor cells 15A-N may be coupled to a corresponding input terminal 38A-N of a capacitor of the capacitor block 136, for example via an inductive bond wire. The input terminals 38A-N may likewise be coupled to the RF output lead 18, for example via an inductive bond wire. The lengths of the inductive bond wires and the capacitance of the capacitors in the capacitor block 136 may be chosen to provide a suitable impedance match at the output of the transistor die 115.

Furthermore, while embodiments of the present application have been described primarily in connection with packaged RF transistors including a single transistor die, multiple transistor dice 115 could be included in a single package 100, with a capacitor block 136 including multiple capacitors provided for one or more of the transistor dice, according to some embodiments of the invention.

A packaged RF power transistor according to embodiments of the invention may be useful in a wide range of applications in which stability is important. For example, a packaged power transistor according to embodiments of the invention may have application in systems, such as WiMAX, WCDMA, CDMA, and/or other systems, including future (4th generation) systems. In general, embodiments of the invention may be useful in any application in which stable operation is desired from a power transistor.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A packaged transistor device, comprising:
   a transistor die including a plurality of transistor cells, each of the plurality of transistor cells including a single transistor including a single control terminal and a single output terminal;
   an input lead; and
   an input matching network coupled between the input lead and the transistor die, the input matching network including a plurality of discrete capacitors having respective input terminals, wherein the input terminals of the discrete capacitors are coupled to the input lead and to the control terminals of respective ones of the transistor cells wherein each transistor cell is connected to a different one of the plurality of discrete capacitors, wherein the plurality of discrete capacitors is provided as a capacitor block between the input lead and transistor die, and wherein the capacitor block comprises a common ground terminal and a plurality of discrete input terminals corresponding to the input terminals of the discrete capacitors.

2. The packaged transistor device of claim 1, wherein the input network further comprises first wire bonds between the input lead and the input terminals of respective ones of the discrete capacitors, and second wire bonds between the input terminals of respective ones of the discrete capacitors and the control terminals of respective ones of the transistor cells.

3. The packaged transistor device of claim 1, further comprising:
   an output lead coupled to the output terminals of respective ones of the transistor cells; and
   a package that houses the transistor die and the input matching network, with the signal input lead and the signal output lead extending from the package.

4. The packaged transistor device of claim 3, further comprising a base, wherein the transistor die is mounted on the base between the input lead and the output lead, and wherein the capacitor block is on the base between the input lead and the transistor die.

5. The packaged transistor device of claim 1, wherein the capacitor block further comprises a common dielectric.

6. The packaged transistor of claim 1, wherein each of the discrete capacitors comprises a ground terminal coupled to the common ground terminal.

7. The packaged transistor device of claim 1, wherein the plurality of transistor cells are aligned in a first direction, and wherein the plurality of discrete capacitors are spaced apart from the plurality of transistor cells in a second direction that is perpendicular to the first direction and are aligned in the first direction.

8. A packaged transistor device, comprising:
   a transistor die including a plurality of transistor cells, each of the plurality of transistor cells including a single transistor including a single control terminal and a single output terminal;
   an input lead; and
   an input matching network coupled between the input lead and the transistor die, the input matching network including a split capacitor including a plurality of input terminals, a common ground terminal and a common dielectric, wherein the input terminals of the split capacitor are coupled to the input lead and to the control terminals of respective ones of the transistor cells wherein each transistor cell is connected to a different one of the plurality of input terminals.

9. The packaged transistor device of claim 8, wherein the input network further comprises first wire bonds between the input lead and respective input terminals of the split capacitor, and second wire bonds between the respective input terminals of the split capacitor and the control terminals of respective ones of the transistor cells.

10. The packaged transistor device of claim 8, further comprising:
    an output lead coupled to the output terminals of respective ones of the transistor cells; and
    a package that houses the transistor die and the input matching network, with the signal input lead and the signal output lead extending from the package.

11. The packaged transistor device of claim 10, further comprising a base, wherein the transistor die is mounted on the base between the input lead and the output lead, and wherein the split capacitor is on the base between the input lead and the transistor die.

12. The packaged RF transistor device of claim 8, wherein the plurality of transistor cells are aligned in a first direction, and wherein the plurality of input terminals are spaced apart from the plurality of transistor cells in a second direction that is perpendicular to the first direction and are aligned in the first direction.

13. A method of forming a packaged transistor device, comprising:
    mounting a transistor on a base, the transistor including a plurality of transistor cells, each of the plurality of transistor cells including a single transistor including a single control terminal and a single output terminal;
    mounting a plurality of discrete capacitors on the base, wherein mounting the plurality of discrete capacitors comprises mounting a capacitor block comprising a common ground terminal and a plurality of discrete input terminals on the base between the input lead and the transistor die;
    coupling the discrete input terminals of the discrete capacitors to the control terminals of respective ones of the transistor cells so that each transistor cell is connected to a different one of the plurality of discrete capacitors; and
    coupling an input lead to the discrete input terminals of the discrete capacitors.

14. The method of claim 13, further comprising:
    forming a package housing on the base, the housing enclosing the transistor and the plurality of discrete capacitors, with the input lead extending from the package.

15. The method of claim 13, further comprising:
    wherein coupling the input lead to the discrete input terminals of the discrete capacitors comprises forming first wire bonds between the input lead and the discrete input terminals of respective ones of the discrete capacitors, and wherein coupling the discrete input terminals of the discrete capacitors to the control terminals of respective ones of the transistor cells comprises forming second wire bonds between the discrete input terminals of respective ones of the discrete capacitors and the control terminals of respective ones of the transistor cells.

16. The method of claim 13, further comprising:
    coupling an output lead to the output terminals of respective ones of the transistor cells; and forming a package housing that houses the transistor die and the plurality of discrete capacitors, with the signal input lead and the signal output lead extending from the package.

17. The method of claim 16, further comprising mounting the transistor die on the base between the input lead and the output lead.

18. The method of claim 17, wherein the capacitor block further comprises a common dielectric.

19. The method of claim 13, wherein the plurality of transistor cells are aligned in a first direction, and wherein the plurality of discrete capacitors are spaced apart from the plurality of transistor cells in a second direction that is perpendicular to the first direction and are aligned in the first direction.

20. A packaged transistor device, comprising:
   an transistor die including a plurality of transistor cells, each of the plurality of transistor cells including a single transistor including a single control terminal and a single output terminal;
   an input lead and an output lead; and
   a matching network coupled between the input lead or the output lead and the transistor die, the matching network including a plurality of discrete capacitors, wherein the plurality of discrete capacitors is provided as a capacitor block on the base between the input lead and the transistor die, wherein the capacitor block comprises a common ground terminal and a plurality of discrete input terminals, and wherein the discrete input terminals of the discrete capacitors are coupled to the input lead and to corresponding control terminals or output terminals of respective ones of the transistor cells so that each transistor cell is connected to a different one of the plurality of discrete capacitors.

21. The packaged transistor device of claim 20, wherein the matching network comprises an output matching network coupled between the output lead and the transistor die, and wherein the discrete input terminals of the discrete capacitors are coupled to corresponding output terminals of respective ones of the transistor cells.

22. The packaged transistor of claim 20, wherein the plurality of transistor cells are aligned in a first direction, and wherein the plurality of input terminals are spaced apart from the plurality of transistor cells in a second direction that is perpendicular to the first direction and are aligned in the first direction.

* * * * *